(12) United States Patent
Chen et al.

(10) Patent No.: US 12,170,327 B2
(45) Date of Patent: Dec. 17, 2024

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Ming-Te Chen, Hsinchu (TW); Hui-Ting Tsai, Tainan (TW); Jun He, Hsinchu (TW); Kuo-Feng Yu, Hsinchu County (TW); Chun Hsiung Tsai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 503 days.

(21) Appl. No.: 17/398,668

(22) Filed: Aug. 10, 2021

(65) Prior Publication Data

US 2022/0320319 A1    Oct. 6, 2022

Related U.S. Application Data

(60) Provisional application No. 63/168,746, filed on Mar. 31, 2021.

(51) Int. Cl.
*H01L 29/66* (2006.01)
*H01L 21/02* (2006.01)
(Continued)

(52) U.S. Cl.
CPC .. *H01L 29/66795* (2013.01); *H01L 21/02255* (2013.01); *H01L 21/02595* (2013.01);
(Continued)

(58) Field of Classification Search
CPC ......... H01L 29/66545; H01L 21/02595; H01L 21/823437; H01L 21/823828
See application file for complete search history.

(56) References Cited

U.S. PATENT DOCUMENTS

| 8,836,016 B2 | 9/2014 | Wu et al. |
|---|---|---|
| 8,841,701 B2 | 9/2014 | Lin et al. |

(Continued)

FOREIGN PATENT DOCUMENTS

TW        202111818 A        3/2021

OTHER PUBLICATIONS

US 20210074810 is the US counterpart of TW 202111818 A.

*Primary Examiner* — Tuan A Hoang
(74) *Attorney, Agent, or Firm* — WPAT LAW; Anthony King

(57) ABSTRACT

A semiconductor structure, a method for manufacturing a FinFET structure and a method for manufacturing a semiconductor structure are provided. The method for forming a FinFET structure includes: providing a FinFET precursor including a plurality of fins and a plurality of gate trenches between the fins; forming a first portion of the trench dummy of a dummy gate within the plurality of gate trenches; removing at least a part of the first portion of the trench dummy; forming a second portion of the trench dummy over the first portion of the trench dummy; performing a first thermal treatment to the first and second portions of the trench dummy; and forming a blanket dummy of the dummy gate over the second portion of the trench dummy. The present disclosure further provides a FinFET structure with an improved metal gate.

20 Claims, 12 Drawing Sheets

(51) Int. Cl.
    *H01L 21/8234*     (2006.01)
    *H01L 27/088*     (2006.01)
    *H01L 29/78*     (2006.01)

(52) U.S. Cl.
    CPC .. *H01L 21/823431* (2013.01); *H01L 27/0886* (2013.01); *H01L 29/66545* (2013.01); *H01L 29/7851* (2013.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2010/0035417 A1* | 2/2010 | Um .................. H01L 21/02532 118/725 |
| 2011/0287629 A1* | 11/2011 | Kakimoto ............. C23C 16/045 156/345.31 |
| 2017/0336711 A1* | 11/2017 | Yamada .................... G03F 7/40 |
| 2018/0151693 A1* | 5/2018 | Li ....................... H01L 29/7851 |
| 2020/0006385 A1* | 1/2020 | Cheng ............... H01L 21/02667 |

\* cited by examiner

SEMICONDUCTOR STRUCTURE AND MANUFACTURING METHOD OF THE SAME

CROSS-REFERENCE TO RELATED APPLICATIONS

This application claims the benefit of U.S. provisional application Ser. No. 63/168,746, filed on 31 Mar. 2021 and titled "FIN STRUCTURE WITH SEAMLESS POLYCRYSTALLINE SILICON LAYER AND PROCESS FOR MAKING THE SAME," which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, forming a three dimension strained channel raises challenges in a FinFET process development. It is desired to have improvements in this area.

The fins of FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
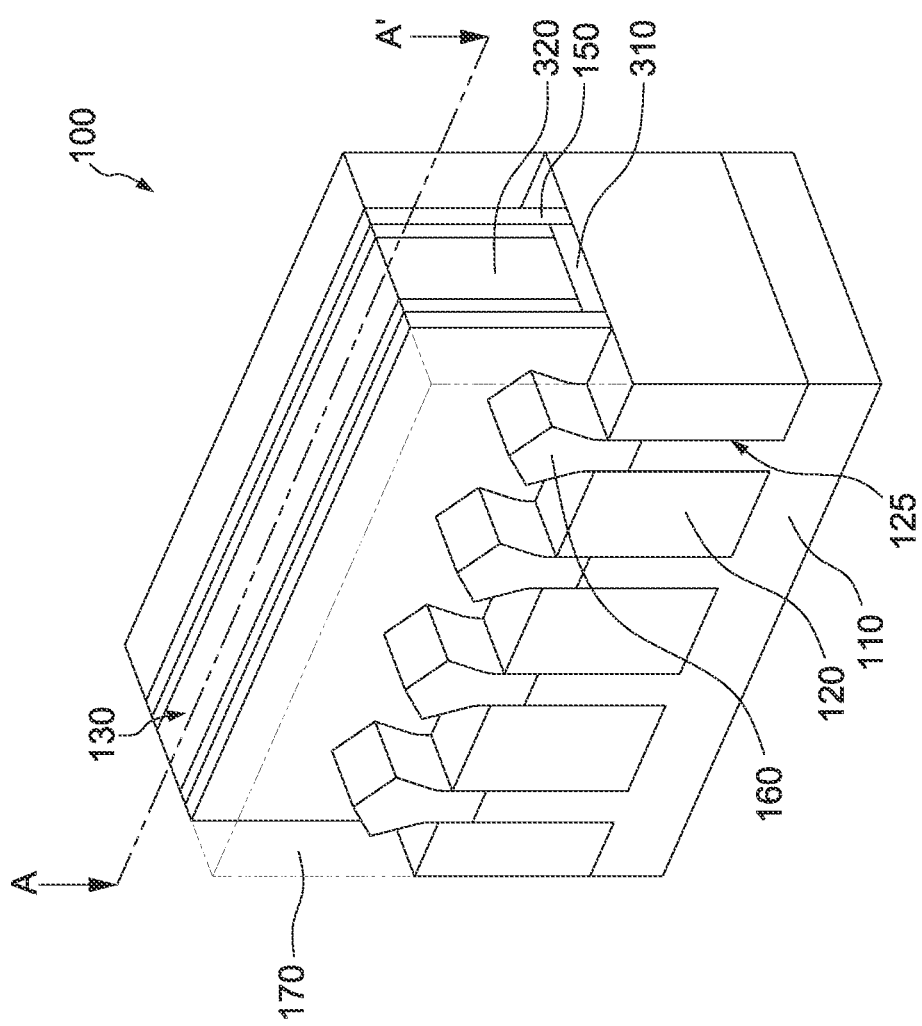
FIG. 1 is a side-perspective of a FinFET structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

Examples of devices that can benefit from one or more embodiments of the present application include FinFET devices or Gate-all-around FET devices. The FinFET device, for example, may be a complementary metal-oxide-semiconductor (CMOS) device including a p-type metal-oxide-semiconductor (PMOS) FinFET device and an n-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

For FinFET devices, it is believed that the quality of a metal gate is related to the presence of coalescence boundary or seam in a dummy gate and to the size distribution, shape and orientation of the grains of the dummy gate. The coalescence boundary or seam generally has a length of about 0.5 to 10 nm and a width of about 0.1 to 2 nm. With the continuous decrease of the technology node, the effects of the coalescence boundary or seam become dominant. There is a need for developing a dummy gate having a reduced density of coalescence boundary or seam and having grains with an equiaxed shape and a homogeneous, uniform or monomodal distribution.

Figure 2:
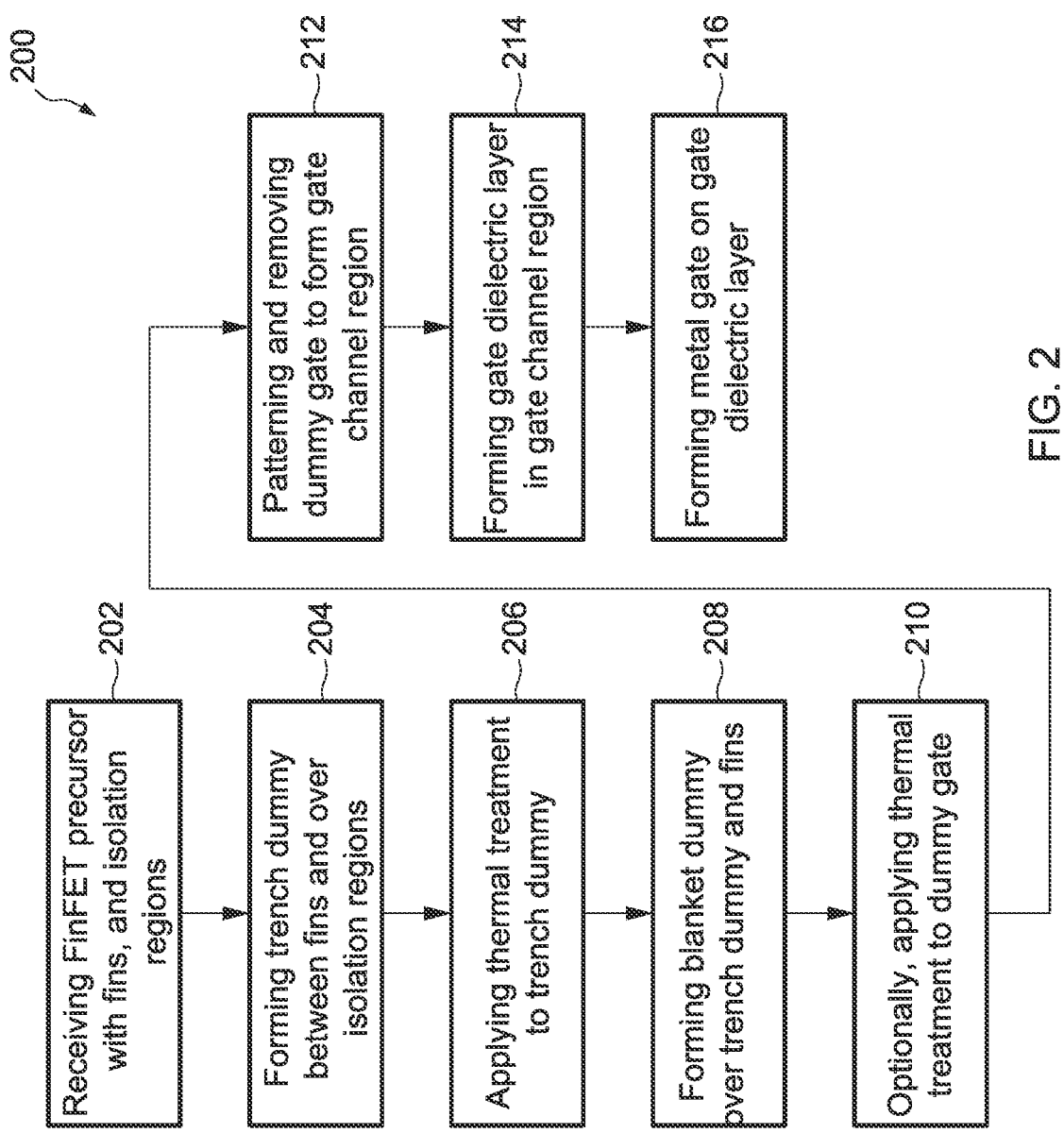
FIG. 2 is a flow chart of a method for manufacturing a FinFET structure and method for manufacturing a semiconductor structure illustrated in FIG. 1.

FIG. 1 is a side-perspective view of a FinFET structure or semiconductor structure, labeled with the reference numeral 100, manufactured according to the method 200 illustrated in FIG. 2. FIG. 2 is a flowchart of the method 200 for manufacturing the FinFET structure 100 and method 200 for manufacturing a semiconductor structure 100 according to an embodiment of the present disclosure. It is understood that additional operations can be provided before, during, and after the method 200 for manufacturing the FinFET structure 100 and method 200 for manufacturing a semiconductor structure 100, and some of the operations described can be replaced or eliminated for other embodiments of the method 200.

Figure 3:
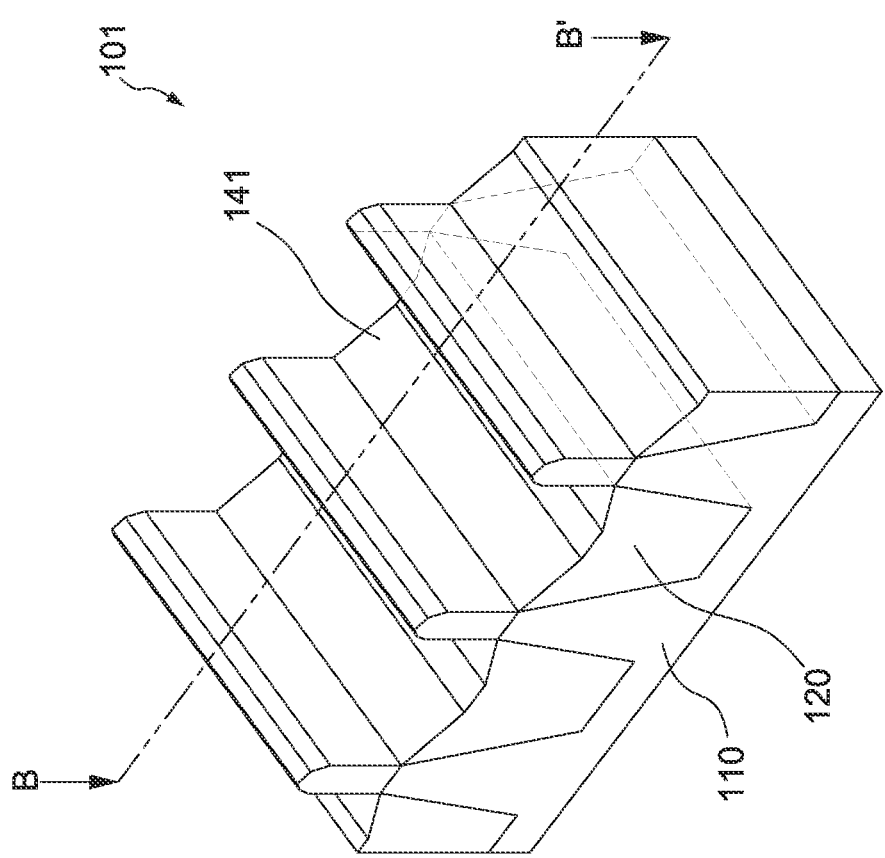
FIG. 3 is a side-perspective of a FinFET precursor for forming the FinFET structure illustrated in FIG. 1 according to various embodiments of the present disclosure.

In an embodiment, the method 200 for manufacturing the FinFET structure 100 and method 200 for manufacturing a semiconductor structure 100 begin at operation 202 by receiving a FinFET precursor 101. FIG. 3 shows the FinFET precursor 101 according to an embodiment of the present disclosure. The FinFET precursor 101 includes a substrate 110. The substrate 110 may be a bulk silicon substrate. Alternatively, the substrate 110 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 110 also include a silicon-on-insulator (SOI) substrate. SOI substrates are fabricated using separation by implantation of oxygen (SIMOX), wafer bonding, and/or other suitable operations.

Some exemplary substrates 110 also include an insulator layer. The insulator layer includes any suitable material, including silicon oxide, sapphire, and/or combinations thereof. An exemplary insulator layer may be a buried oxide layer (BOX). The insulator is formed by any suitable operation, such as implantation (e.g., SIMOX), oxidation, deposition, and/or other suitable operation. In some exemplary FinFET precursors 200, the insulator layer is a component (e.g., layer) of a silicon-on-insulator substrate.

The FinFET precursor 101 may also include various doped regions (not shown in FIG. 3) on the substrate 110. The doped regions may be doped with p-type dopants, such as boron or $BF_2$; n-type dopants, such as phosphorus or arsenic; or combinations thereof. The doped regions may be formed directly on the substrate 110, in a p-well structure, in an n-well structure, in a dual-well structure, or using a raised structure. The substrate 110 may further include various active regions (not shown in FIG. 3), such as regions configured for an n-type metal-oxide-semiconductor transistor device and regions configured for a p-type metal-oxide-semiconductor transistor device.

The FinFET precursor 101 may include isolation regions 120 formed on the substrate 110 to isolate active regions of the substrate 110. The isolation region 120 may be formed using traditional isolation technology, such as shallow trench isolation (ST), to define and electrically isolate the various regions. The isolation region 120 includes silicon oxide, silicon nitride, silicon oxynitride, an air gap, other suitable materials, or combinations thereof. The isolation region 120 is formed by any suitable operation. As one example, the formation of an STI includes a photolithography operation, an etch operation to etch a trench in the substrate 110 (for example, by using a dry etching and/or wet etching), and a deposition to fill in the trench (for example, by using a chemical vapor deposition operation) with one or more dielectric materials. In some examples, the filled trench may have a multi-layer structure such as a thermal oxide liner layer filled with silicon nitride or silicon oxide. In the present embodiment, where the substrate 110 remaining between trenches forms fins or protrusions 125 and the fins or protrusions 125 are separated by the isolation regions 120. Any of the isolation regions 120 and its neighboring two fins or protrusions 125 define a gate trench 141. In some aspects of the present disclosure, the gate trenches 141 may have a height of 35 to 70 nm, for example, but being not limited to: 35, 40, 45, 50, 55, 60, 65 or 70 nm. The gate trenches 141 may have a width of 10 to 50 nm, for example, but being not limited to: 10, 15, 20, 25, 30, 35, 40, 45, 50, 55, 60, 65 or 70 nm. The height-to-width aspect ratio of the gate trenches 141 ranges from 0.7 to 7.

Figure 4:
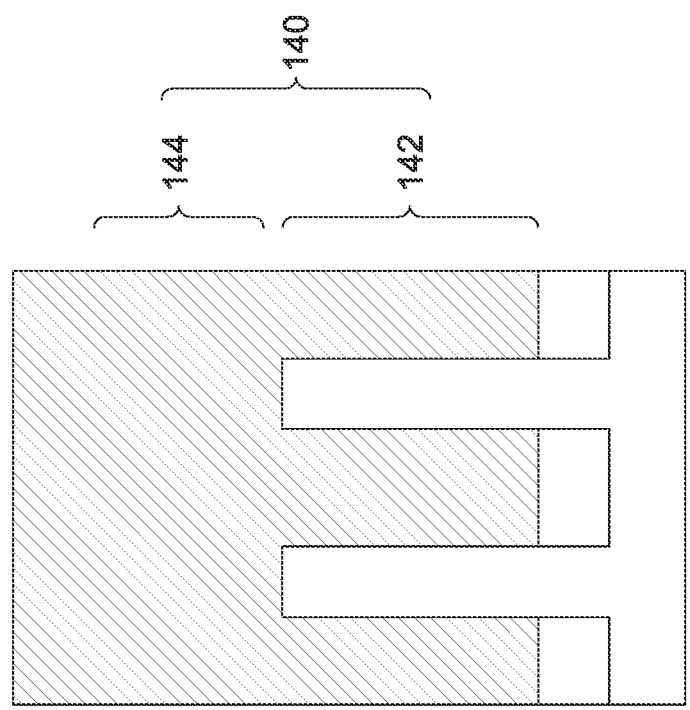
FIG. 4 illustrates a cross sectional view of a dummy gate according to various embodiments of the present disclosure disposed over the FinFET precursor along line A-A' in FIG. 1 or line B-B' in FIG. 3.

In FIG. 2, operations 204 to 210 are directed to an operation for forming a dummy gate 140 over the FinFET precursor 101 according to various embodiments of the present disclosure. FIG. 4 shows a cross-section view of the arrangement of the dummy gate 140 on the FinFET precursor 101 taken along line A-A' in FIG. 1 or line B-B' in FIG. 3. The dummy gate 140 includes a trench dummy 142 disposed over the isolation regions 120 and between the fins or protrusions 125. The dummy gate 140 also includes a blanket dummy 144 over the fins or protrusions 125 and trench dummy 142. The dummy gate 140 are to be replaced later by a gate dielectric layer 310 and metal gate 320 after high thermal temperature operations are performed, such as thermal operations during sources/drains formation.

Figure 5:
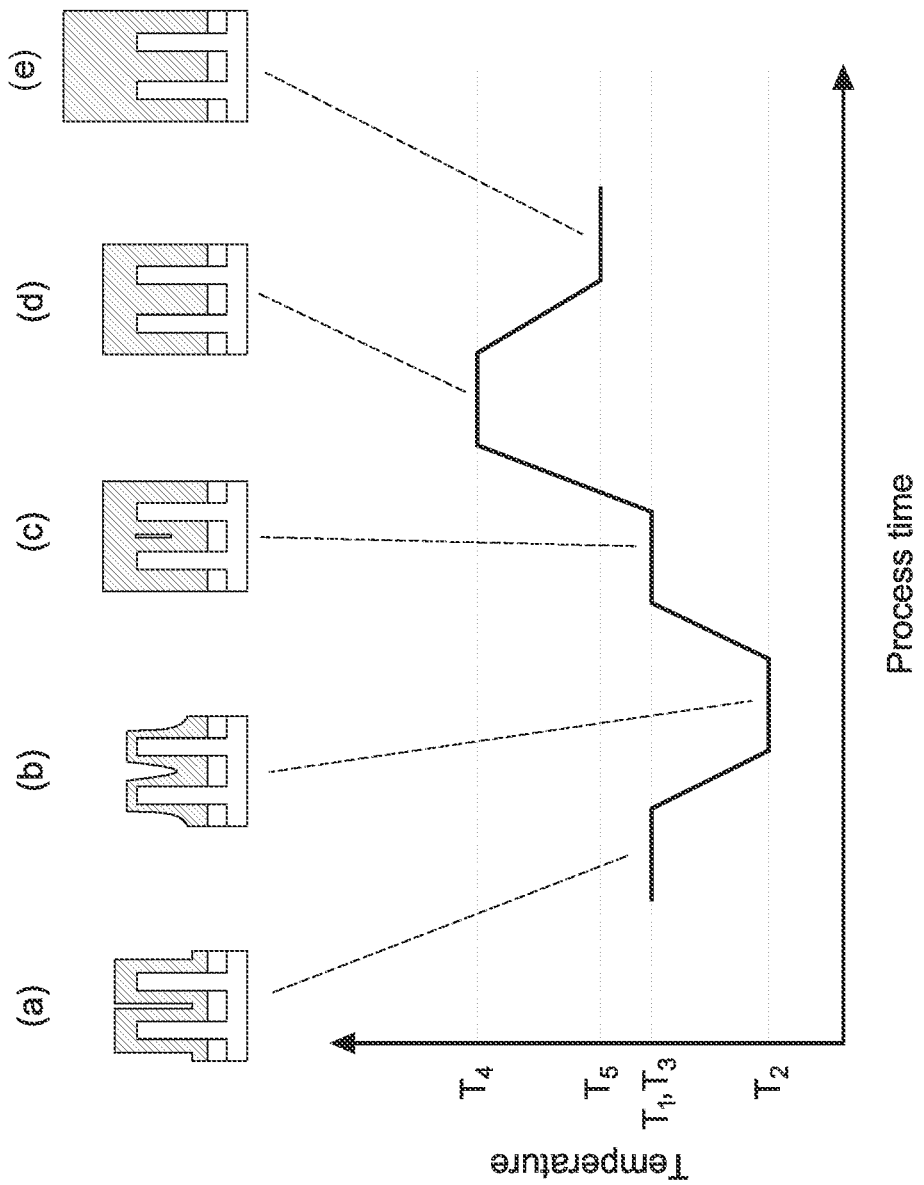
FIG. 5, including parts (a) to (e), shows a temperature profile of an operation for forming a dummy gate according to various embodiments of the present disclosure.
Figure 6:
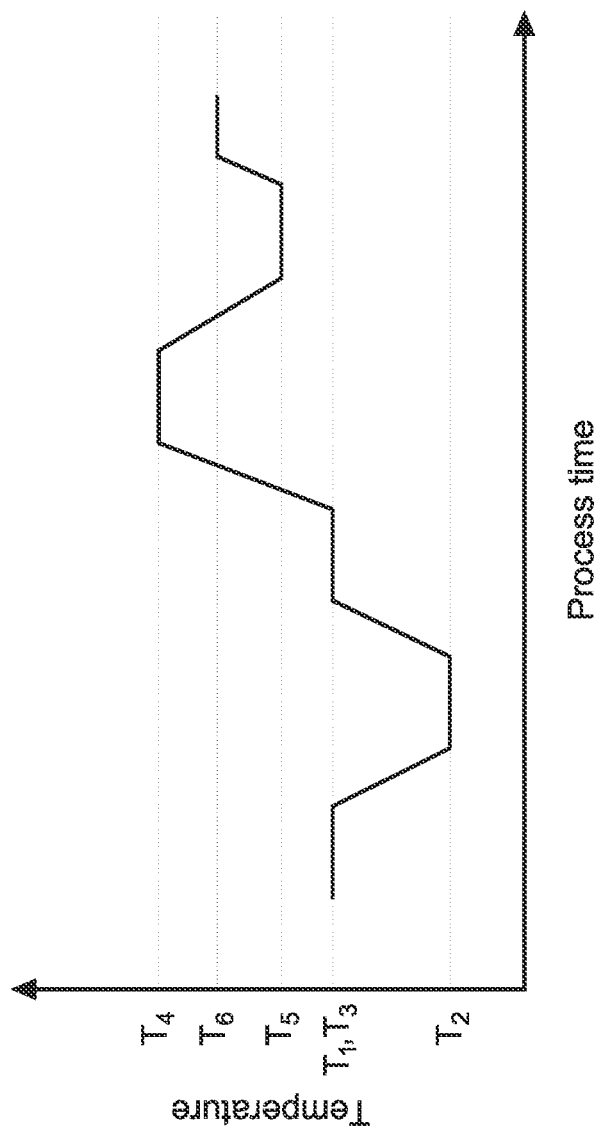
FIG. 6 shows a temperature profile of an operation for forming a dummy gate according to various embodiments of the present disclosure.

Operation 204 is directed to the formation of the trench dummy 142 by way of a formation-removal cycle or specifically deposition-etching cycle. Parts (a) to (c) of FIG. 5 show a temperature profile for the formation-removal cycle according to an embodiment of the present disclosure. The cycle includes in sequence: (1) forming a first portion of the trench dummy of the dummy gate 140 at a temperature $T_1$ within the gate trenches 141 (FIG. 5, part (a)); (2) removing at least a part of the first portion of the trench dummy disposed within the gate trenches 141 at a temperature $T_2$ (FIG. 5, part (b)), and (3) forming a second portion of the trench dummy 140 over first portion of the trench dummy at a temperature $T_3$ (FIG. 5, part (c)). In some aspects of the present disclosure, $T_1>T_2$, $T_3>T_2$, $T_1>T_3$, $T_1=T_3$ or $T_1<T_3$. In an embodiment, $T_1=T_3>T_2$. In some embodiments, the first portion of the trench dummy may be formed over the fins or protrusions 125. The first portion of the trench dummy may be formed over the isolation regions 120. In further embodiments, the first portion of the trench dummy includes an amorphous structure. The first portion of the trench dummy is substantially consisted of an amorphous structure. The first portion of the trench dummy is consisted of an amorphous structure. The second portion of the trench dummy includes an amorphous structure. The second portion of the trench dummy is substantially consisted of an amorphous structure. The second portion of the trench dummy is consisted of an amorphous structure. In further embodiments, the first portion of the trench dummy includes a silicon-containing material, e.g. Si. The second portion of the trench dummy includes a silicon-containing material, e.g. Si.

The formation cycle may be performed by way of a deposition operation, which includes chemical vapor deposition (CVD), physical vapor deposition (PVD), atomic layer deposition (ALD), other suitable operations, and/or combinations thereof. The removal cycle may be performed by way of an etching operation, which includes dry etching, wet etching, and/or other etching operations (e.g., reactive ion etching).

The time for forming the first or second portion of the trench dummy should be sufficient so that the trench dummy 142 covers isolation regions 120. The trench dummy 142 may contact the isolation regions 120. The first portion of the trench dummy 142 may contact the isolation regions 120. The second portion of the trench dummy 142 may not contact the isolation regions 120. In some embodiments, $T_1$ or $T_3$ may be 300 to 550° C., for example, but being not limited to: 300, 310, 320, 330, 340, 350, 360, 370, 380, 390, 400, 410, 420, 430, 440, 450, 460, 470, 480, 490, 500, 510, 520, 530, 540 or 550° C. The time for forming the first or second portion of the trench dummy 142 may be 120 to 600 sec., for example, but being not limited to: 120, 150, 180, 210, 240, 270, 300, 330, 360, 390, 420, 450, 480, 510, 540, 570 or 600 sec. The proportion of the total volume of one gate trench 141 to be filled by the trench dummy 142 may range from 5 to 95%, for example, but being not limited to: 5, 10, 15, 20, 25, 30, 35, 40, 45, 50, 55, 60, 65, 70, 75, 80, 85, 90 or 95%. In some embodiments, the first portion of the trench dummy may have a thickness of 2 to 10 nm, for example, but being not limited to: 2, 2.5, 3, 3.5, 4, 4.5, 5, 5.5, 6, 6.5, 7, 7.5, 8, 8.5, 9, 9.5 or 10 nm. The first second dummy may have a thickness of 2 to 10 nm, for example, but being not limited to: 2, 2.5, 3, 3.5, 4, 4.5, 5, 5.5, 6, 6.5, 7, 7.5, 8, 8.5, 9, 9.5 or 10 nm.

The time for the removal of the at least a part of the first portion of the trench dummy 142 disposed within the plurality of gate trenches 141 should be controlled so that the trench dummy 142 remains to be present over the isolation regions 120. The time for the removal cycle may be 120 to 600 sec., for example, but being not limited to: 120, 150, 180, 210, 240, 270, 300, 330, 360, 390, 420, 450, 480, 510, 540, 570 or 600 sec. In further embodiments, $T_2$ may be 350 to 600° C., for example, but being not limited to: 350, 360, 370, 380, 390, 400, 410, 420, 430, 440, 450, 460, 470, 480, 490, 500, 510, 520, 530, 540, 550, 560, 570, 580, 590 or 600° C. The proportion of the total volume of the trench dummy 142 within one gate trench 141 to-be removed may range from 5 to 95%, for example, but being not limited to: 5, 10, 15, 20, 25, 30, 35, 40, 45, 50, 55, 60, 65, 70, 75, 80, 85, 90 or 95%.

In some embodiments, to ensure that the first portion of the trench dummy 142 covers or contacts the isolation regions 120 or the sidewalls of the fins or protrusions 125, before the removal operation, a first thermal treatment may be performed to cause the reflow of the atoms in the trench dummy 142 (not shown in the figures). In this context, the thermal treatment includes rapid thermal annealing (RTA) and/or laser annealing operations. The first thermal treatment may be performed under a protective gas atmosphere, for example, but being not limited to: $N_2$ or Ar. The first thermal treatment may be performed at a temperature of 450 to 700° C., for example, but being not limited to: 450, 460, 470, 480, 490, 500, 510, 520, 530, 540, 550, 560, 570, 580, 590, 600, 610, 620, 630, 640, 650, 670, 680, 690 or 700° C. The time for the thermal treatment may be 120 to 600 sec., for example, but being not limited to: 120, 150, 180, 210, 240, 270, 300, 330, 360, 390, 420, 450, 480, 510, 540, 570 or 600 sec.

In some embodiments, the formation-removal cycle is repeated for one, two, three, four, five or more times so that 80% or more of the total volume of the gate trench 141, for example, but being not limited to: 80, 82, 84, 85, 86, 88, 90, 92, 94, 95, 96, 98 or 100%, is filled with the trench dummy 142. Specifically, subsequent to the formation of the second portion of the trench dummy, another removal operation can be formed to remove at least a part of the second portion of the trench dummy disposed within the gate trenches 141, and then forming a third portion of the trench dummy 142 over second portion of the trench dummy 142, and so on. In some embodiment, the first thermal treatment that cause the reflow of the trench dummy 142 is performed during the first formation-removal cycle, in which the trench dummy 142 contacts the isolation regions 120 or the sidewalls of the fins or protrusions 125.

As shown in FIG. 5, part (d), in some embodiments, to reduce the density of coalescence boundary or seam in the trench dummy 142, a second thermal treatment (operation 206 in FIG. 2) may be applied to the trench dummy 142. In some embodiments, the second thermal treatment may be performed under a protective gas atmosphere, for example, but being not limited to: $N_2$ or Ar. The second thermal treatment may be performed at a temperature of $T_4$ ranges from 500 to 950° C., for example, but being not limited to: 500, 550, 600, 650, 700, 750, 800, 850, 900 and 950° C. The time for the second thermal treatment may be 120 to 600 sec., for example, but being not limited to: 120, 150, 180, 210, 240, 270, 300, 330, 360, 390, 420, 450, 480, 510, 540, 570 or 600 sec. In some embodiments, after the second thermal treatment, the phase of the trench dummy 142 changes from amorphous to micro-polycrystalline. In this context, micro-polycrystalline particularly refers to a polycrystalline substance with an average grain size of 0.5 to 10 nm. Specifically, after the second thermal treatment, the trench dummy 142 may have an average grain size ranges from 0.5 to 10 nm, for example, but being not limited to: 0.5, 1, 1.5, 2, 2.5, 3, 3.5, 4, 4.5, 5, 5.5, 6, 6.5, 7, 7.5, 8, 8.5, 9, 9.5 or 10 nm. In some embodiments, after the second thermal treatment, the trench dummy 142 may include equiaxed grains. In some embodiments, after the second thermal treatment, the trench dummy 142 may have a homogeneous or uniform grain size distribution. After the second thermal treatment, the trench dummy 142 may have a monomodal grain size distribution.

As show in FIG. 5, part (e), the method 200 for manufacturing the FinFET structure 100 and method 200 for manufacturing a semiconductor structure 100 further include an operation 208 of forming the blanket dummy 144 at a temperature $T_5$ over the trench dummy 142. The temperature $T_5$ may be equal to the first temperature $T_1$. In some embodiments, $T_5 > T_1$, $T_5 > T_2$, $T_5 > T_3$ or $T_5 < T_4$. In an embodiment, $T_4 > T_5 > T_1 > T_2$ or $T_4 > T_5 > T_3 > T_2$. In some embodiments, $T_5$ may be 300 to 550° C., for example, but being not limited to: 300, 310, 320, 330, 340, 350, 360, 370, 380, 390, 400, 410, 420, 430, 440, 450, 460, 470, 480, 490, 500, 510, 520, 530, 540 or 550° C. In some embodiments, the blanket dummy 144 may be also formed over the fins or protrusions 125. The time for forming the blanket dummy 144 may be 120 to 900 sec., for example, but being not limited to: 120, 150, 180, 210, 240, 270, 300, 330, 360, 390, 420, 450, 480, 510, 540, 570, 600, 630, 660, 690, 720, 750, 780, 810, 840, 870 or 900 sec. In further embodiments, the blanket dummy 144 includes a micro-polycrystalline structure. The blanket dummy 144 is substantially consisted of a micro-polycrystalline structure. The blanket dummy 144 is substantially consisted of a micro-polycrystalline structure. Specifically, the blanket dummy 144 may have a grain size ranges from 0.5 to 10 nm, for example, but being not limited to: 0.5, 1, 1.5, 2, 2.5, 3, 3.5, 4, 4.5, 5, 5.5, 6, 6.5, 7, 7.5, 8, 8.5, 9, 9.5 or 10 nm. The blanket dummy 144 may include equiaxed grains. The blanket dummy 144 may have a homogeneous grain size distribution. The blanket dummy 144 may have a monomodal grain size distribution. In further embodiments, the blanket dummy includes a silicon-containing material, e.g. Si.

In some embodiments, the dummy gate 140 including the trench dummy 142 and the blanket dummy 144 may have a homogeneous grain size distribution. The dummy gate 140 including the trench dummy 142 and the blanket dummy 144 may have a monomodal grain size distribution. In further embodiments, the dummy gate 140 including the trench dummy 142 and the blanket dummy 144 may have a heterogeneous or uniform grain size distribution. The dummy gate 140 including the trench dummy 142 and the blanket dummy 144 may have a bimodal grain size distribution. Specifically, the bimodal grain size distribution may refer to the case that a grain size mismatch between the trench dummy 142 and the blanket dummy 144, which is defined according to the following equation, exceeds 5%, for example, but being not limited to: 5, 5.5, 6, 6.5, 7, 7.5, 8, 8.5, 9, 9.5, 10, 10.5, 11, 11.5, 12, 12.5, 13, 13.5, 14, 14.5 or 15%.

$$\text{Grain size mismatch} = \frac{|\text{average grain size of the blanket dummy 144} - \text{average grain size of the trench dummy}|}{\text{average grain size of the trench dummy}}$$

Without wishing to be bound by theory, it has been found that in a FinFET device, the grain size of a dummy gate and the line edge roughness of the metal gate are relevant. Generally, an equiaxed grains with a homogeneous, uniform and monomodal distribution a dummy gate leads to a high-quality metal gate. In some aspects of the present disclosure, if the dummy gate 140 including the trench dummy 142 and the blanket dummy 144 has a bimodal grain size distribution, to reduce the grain size mismatch, a third thermal treatment of operation 210 (see FIG. 2) may be performed on the dummy gate 140 to cause the reflow of the atoms in the dummy gate 140. The third thermal treatment may be performed under a protective gas atmosphere, for example, but being not limited to: $N_2$ or Ar at a temperature $T_6$. $T_6$ ranges from 500 to 950° C., for example, but being not limited to: 500, 550, 600, 650, 700, 750, 800, 850, 900 and 950° C. The time for the third thermal treatment may be 120 to 600 sec., for example, but being not limited to: 120, 150, 180, 210, 240, 270, 300, 330, 360, 390, 420, 450, 480, 510, 540, 570 or 600 sec. In some embodiments, $T_6 > T_1$, $T_6 > T_2$, $T_6 > T_3$, $T_6 < T_4$, or $T_6 > T_5$. In an embodiment, $T_2 < T_1 < T_5 < T_6 < T_4$ or $T_2 < T_3 < T_5 < T_6 < T_4$. After the third thermal treatment, the dummy gate 140 including the trench dummy 142 and the blanket dummy 144 may have a monomodal grain size distribution. Specifically, the grain size mismatch is reduced to 5% or less, for example, but being not limited to: 5, 4.8, 4.6, 4.5, 4.4, 4.2, 4, 3.8, 3.6, 3.5, 3.4, 3.2, 3, 2.8, 2.6, 2.5, 2.4, 2.2, 2, 1.8, 1.6, 1.5, 1.4, 1.2, 1, 0.8, 0.6, 0.5, 0.4 or 0.2%.

Figure 7:
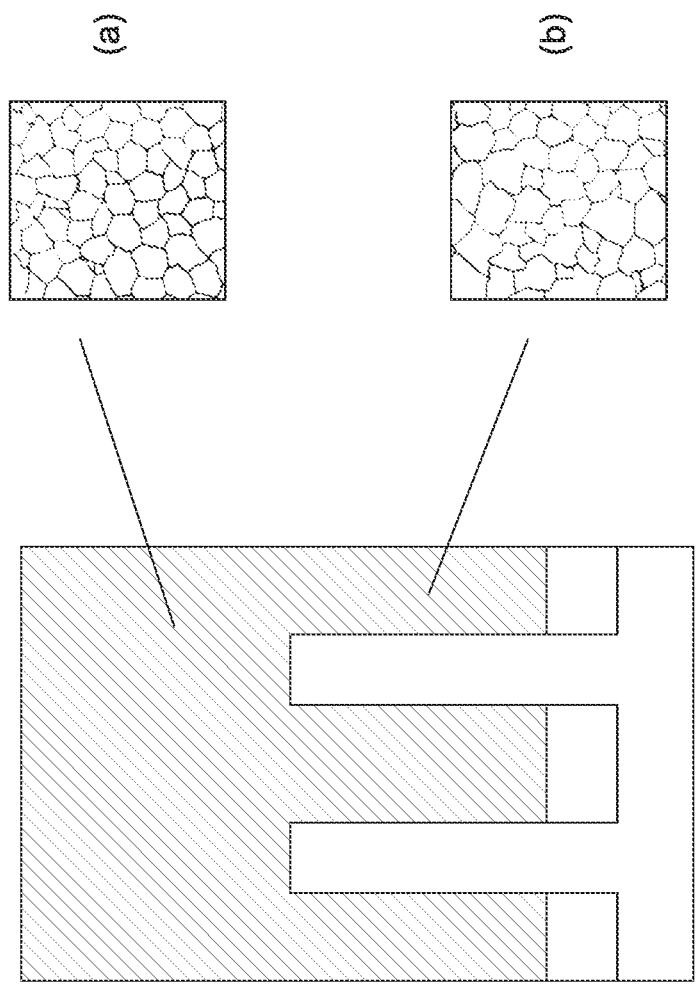
FIG. 7, including parts (a) and (b), shows schematic diagrams of the grains in a dummy gate according to various embodiments of the present disclosure.

FIG. 7 shows the schematic diagrams of the grains of the blanket dummy 144 (FIG. 7, part (a)) and the grains of the trench dummy 142 (FIG. 7, part (b)) subjected to the third thermal treatment according to some embodiments of the present disclosure. The blanket dummy 144 and the trench dummy 142 both includes equiaxed grains. The blanket dummy 144 and the trench dummy 142 are both substantially consisted of equiaxed grains. The blanket dummy 144 and the trench dummy 142 are both consisted of equiaxed grains. The blanket dummy 144 and the trench dummy 142 both includes micro-polycrystalline grains. The blanket dummy 144 and the trench dummy 142 are both substantially consisted of micro-polycrystalline grains. The blanket dummy 144 and the trench dummy 142 are both consisted of micro-polycrystalline grains. In further embodiments, after the third thermal treatment, the dummy gate 140 has a homogeneous or uniform grain size distribution. The dummy gate 140 has a monomodal grain size distribution.

In some embodiments, if Si is selected as the silicon-containing material, the source for forming the dummy gate 140 may be, for example, but being not limited to: monosilane ($SiH_4$) or disilane ($Si_2H_6$); the etchant for removing the dummy gate 140 may be, for example, but being not limited to: $Cl_2$.

Figure 8:
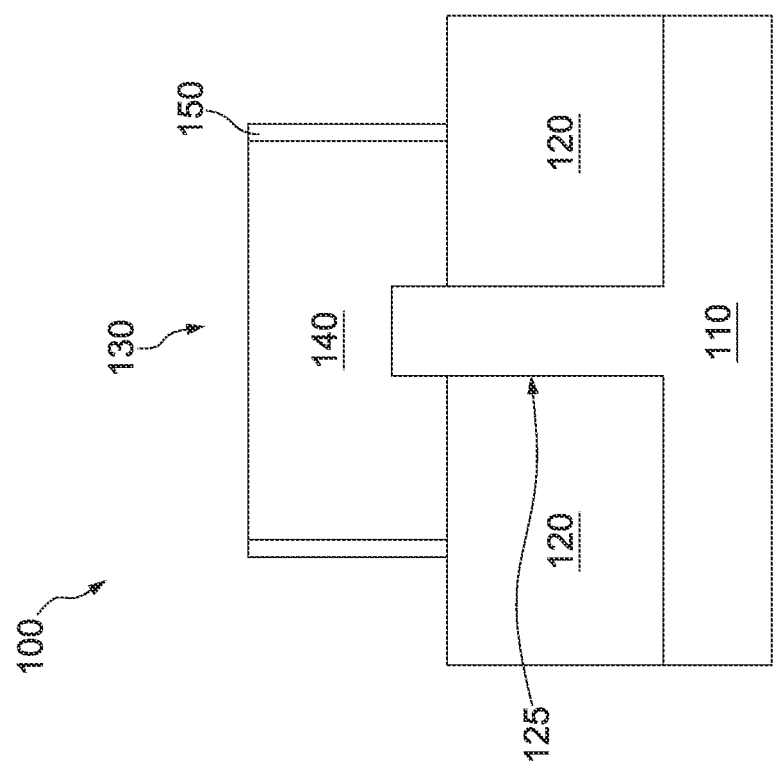
FIGS. 8 to 11 illustrates cross sectional views of the FinFET structure along line A-A' in FIG. 1.

Referring to FIGS. 2 and 8, after the completion of the dummy gate 140, the method 200 for manufacturing the FinFET structure 100 and method 200 for manufacturing a semiconductor structure 100 proceed to operation 212 by patterning the dummy gate 140 through a photolithography operation to define gate channel region 130. Then, the sidewall spacers 150 may be formed along the patterned dummy gate 140. The sidewall spacers 150 may include a dielectric material such as silicon oxide, silicon nitride, silicon carbide, silicon oxynitride, or combinations thereof. Typical formation operations for the sidewall spacers 150 include depositing a dielectric material over the dummy gate 14 and then anisotropically etching back the dielectric material. The etching back operation may include a multiple-step etching to gain etch selectivity, flexibility and desired overetch control.

Figure 9:
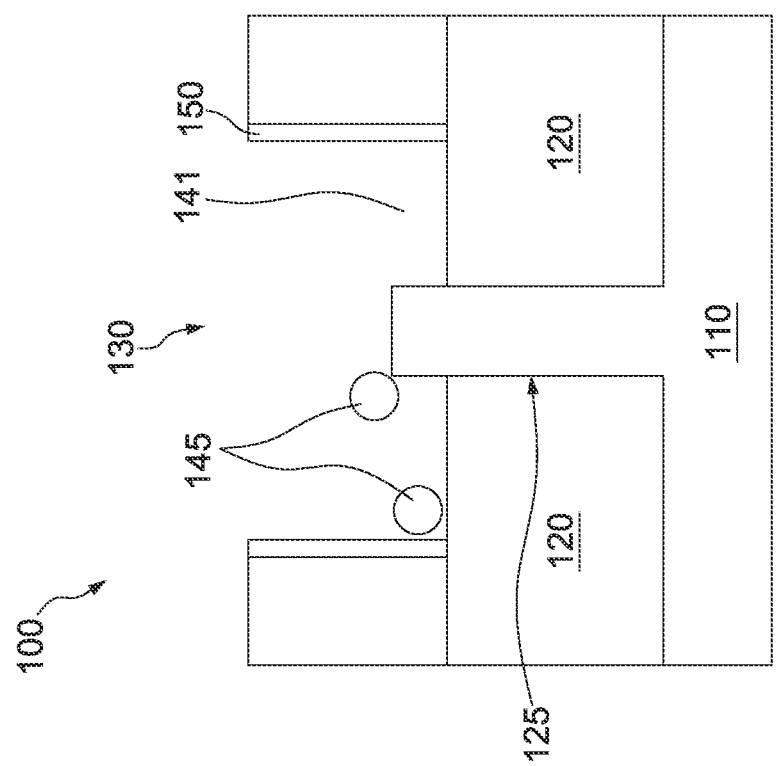

Referring to FIGS. 1, 2 and 9, the FinFET precursor 101 may also include source/drain features 160 (not shown in FIG. 9) formed on the substrate 110. The source/drain features 160 may be formed by recessing a portion of the fin 125 beside the gate channel region 130 to form source/drain recessing trenches and epitaxially growing a semiconductor material layer on the recessed fin 125 in the sources/drains recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial operations include CVD deposition techniques (e.g., vapor-phase epitaxy (VPE) and/or ultra-high vacuum CVD (UHV-CVD)), molecular beam epitaxy, and/or other suitable operations. The source/drain features 160 may be formed by one or more epitaxy or epitaxial (epi) operations. The source/drain features 160 may be in-situ doped during the epi operation. One or more thermal treatments may be performed to activate source/drain epitaxial feature.

The FinFET precursor 101 may also an interlayer dielectric (ILD) layer 170 formed on the substrate 110 including between the dummy gate 140. The ILD layer 170 includes silicon oxide, oxynitride or other suitable materials. The ILD layer 170 includes a single layer or multiple layers. The ILD layer 170 is formed by a suitable technique, such as CVD, ALD and spin-on (SOG). A chemical mechanical polishing (CMP) operation may be performed to remove excessive ILD layer 170 and planarize the top surface of the ILD layer 170 with the top surface of the dummy gate 140.

The dummy gate 140 is then removed to expose the gate channel region 130 of the fins or protrusions 125. The dummy gate 140 may be removed by lithography pattern and etch operations. Alternatively, the dummy gate 140 may be removed by a selective wet etch or a selective dry etch. The photolithography patterning operations include photoresist coating (e.g., spin-on coating), soft baking, mask aligning, exposure, post-exposure baking, developing the photoresist, rinsing, drying (e.g., hard baking), other suitable operations, and/or combinations thereof. In some embodiments, the gate channel region 130 may include one or more micro-polycrystalline dummy gate residues or particles 145 with a diameter of 0.5 to 3 nm, for example, but being not limited to: 0.5, 0.6, 0.8, 1, 1.2, 1.4, 1.5, 1.6, 1.8, 2, 2.2, 2.4, 2.5, 2.6, 2.8 or 3 nm.

Figure 10:
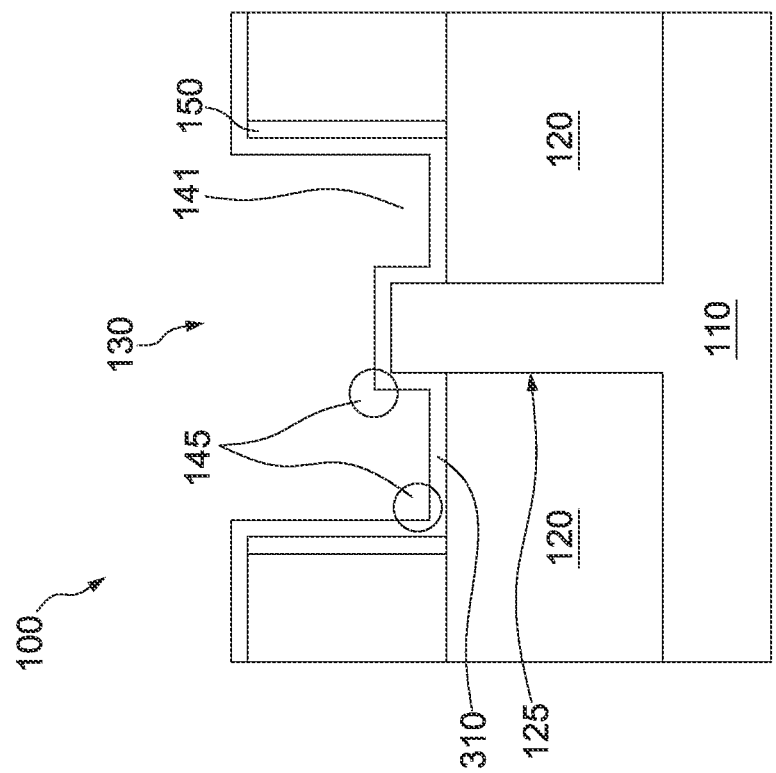

Referring to FIGS. 2 and 10, the method 200 for manufacturing the FinFET structure 100 and method 200 for manufacturing a semiconductor structure 100 proceed to operation 214 by depositing a gate dielectric layer 310 within the gate channel region 130 and over the isolation regions 120 on the substrate 110. The gate dielectric layer 310 may include an interfacial layer deposited by any appropriate operation, such as atomic layer deposition (ALD), chemical vapor deposition CVD and ozone oxidation. The interfacial layer includes oxide, HfSiO and oxynitride. The gate dielectric layer 310 may also include a high-k dielectric layer deposited on the interfacial layer by suitable techniques, such as ALD, CVD, metalorganic CVD (MOCVD), physical vapor deposition (PVD), thermal oxidation, combinations thereof, or other suitable techniques. The high-k dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. In some embodiments, the gate dielectric layer 310 may include one or more micro-polycrystalline dummy gate residues or particles 145 with a diameter of 0.5 to 3 nm, for example, but being not limited to: 0.5, 0.6, 0.8, 1, 1.2, 1.4, 1.5, 1.6, 1.8, 2, 2.2, 2.4, 2.5, 2.6, 2.8 or 3 nm.

Figure 11:
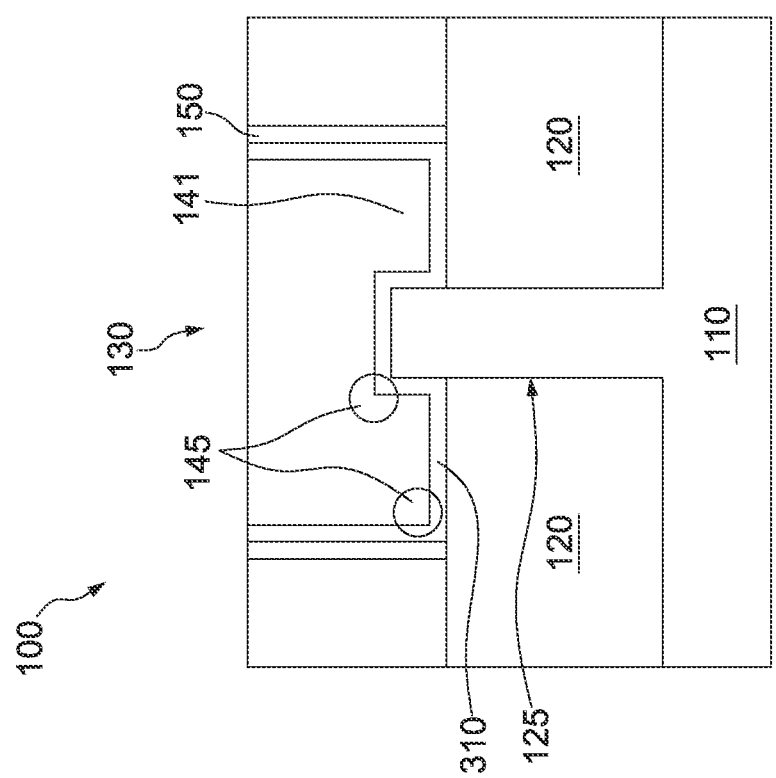

Referring to FIGS. 2 and 11, the method 200 for manufacturing the FinFET structure 100 and method 200 for manufacturing a semiconductor structure 100 proceed to operation 216 by forming a metal gate 320 on the gate dielectric layer 310. The metal gate 320 may include a single layer or multi layers. The metal gate 320 may include Ti, Ag, Al, TiAlN, TaC, TaCN, TaSiN, Mn, Zr, TiN, TaN, Ru, Mo, Al, WN, Cu, W, Co, Ni, TiC, TiAlC, TaAlC, or any suitable materials. The metal gate 320 may be formed by ALD, PVD, CVD, or other suitable operation. In some embodiments, the metal gate 320 may have an average line edge roughness of 1 to 5 nm as measured by a scanning electron microscope. The line edge roughness of the metal gate 320 may have a homogeneous or uniform distribution. The line edge roughness of the metal gate 320 may have a monomodal distribution. In further embodiments, the metal gate 320 may include one or more micro-polycrystalline dummy gate residues or particles 145 with a diameter of 0.5 to 3 nm, for example, but being not limited to: 0.5, 0.6, 0.8, 1, 1.2, 1.4, 1.5, 1.6, 1.8, 2, 2.2, 2.4, 2.5, 2.6, 2.8 or 3 nm.

A CMP may be performed to remove excessive metal gate 320 and dielectric layer 310. The CMP provides a substantially planar top surface for the metal gate 320 and the ILD layer 170.

Additional operations can be provided before, during, and after the method 200 for manufacturing the FinFET structure 100 and method 200 for manufacturing a semiconductor structure 100, and some of the operations described can be replaced, eliminated, or moved around for additional embodiments of the method 200.

The FinFET precursor 101 may include additional features, which may be formed by subsequent operation. For example, various contacts/vias/lines and multilayer interconnect features (e.g., metal layers and interlayer dielectrics) may be formed over the substrate, configured to connect the various features or structures of the FinFET precursor 101. For example, a multilayer interconnection includes vertical interconnects, such as conventional vias or contacts, and horizontal interconnects, such as metal lines. The various interconnection features may implement various conductive materials including copper, tungsten, and/or silicide.

Figure 12:
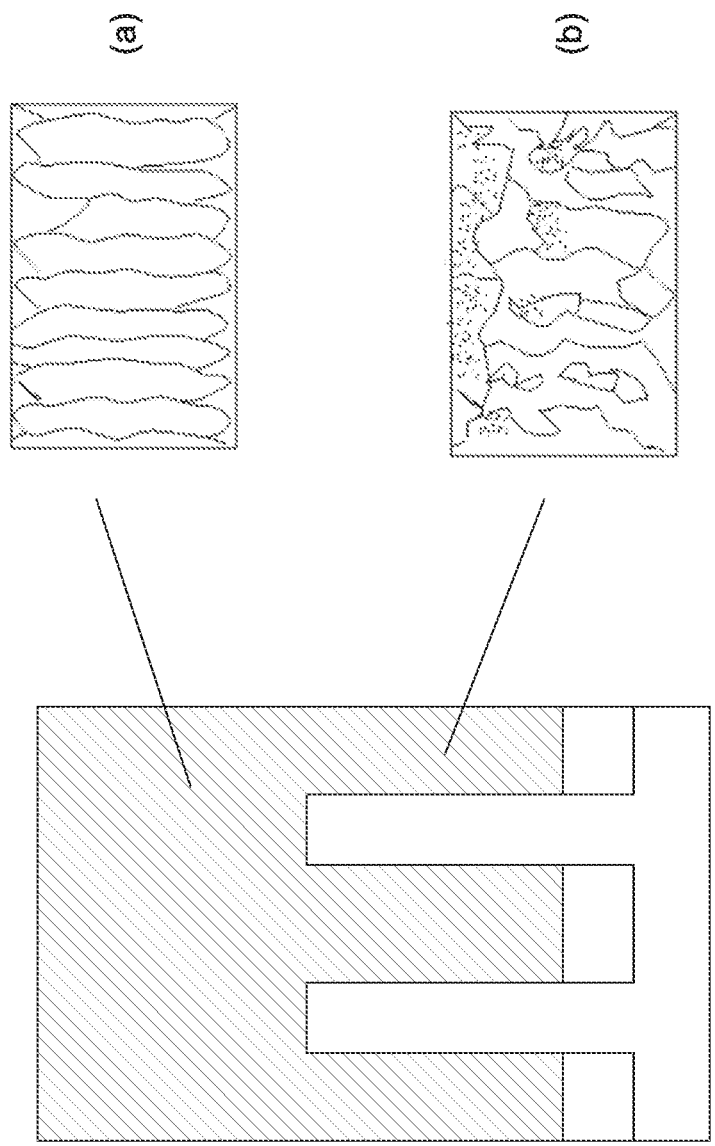
FIG. 12, including parts (a) and (b), shows schematic diagrams of the grains in a dummy gate according to comparative embodiments of the present disclosure.

In comparative embodiments, a first polycrystalline material, instead of an amorphous material, is filled in the gate trenches 141 at a temperature $T_7$ as the trench dummy 142 by way of the aforementioned deposition-etching cycle. Then, a second polycrystalline material is immediately formed over the first polycrystalline material as the blanket dummy 144 at a temperature $T_8$ higher than $T_7$. To reduce the density of the coalescence boundary or seam, a thermal treatment may be applied to the first and polycrystalline materials. FIG. 12 illustrates the grains of the blanket dummy 144 and trench dummy 142 after the thermal treatment. Part (a) of FIG. 12 shows that the blanket dummy 144 includes anisotropic columnar grains with an elongated grain axis substantially parallel to the normal of the surface of the substrate. Part (b) of FIG. 12 shows that the trench dummy 142 includes anisotropic elongated grains that are randomly distributed in the trench dummy 142. In this comparative embodiment, the gate dummy 140 have a bimodal grains size distribution. The grain size mismatch between the trench dummy 142 and the blanket dummy 144 may exceed 10%, 15%, 20%, 25% or more. Moreover, without wishing to be bound by theory, it is believed that the etching rate for removing of the dummy gate 140 is related to the arrangement of the grain boundaries in the dummy gate 140. Hence, the degree of the anisotropy of the granular shape of the dummy gate 140, e.g. columnar grains, restricts the process window of removing the dummy gate 140. In addition, since the dummy gate 140 has a bimodal size distribution, it can be expected that the line edge roughness of the metal gate 320 to be formed may have a heterogeneous and non-uniform distribution. For example, the metal gate 320 illustrated in the comparative embodiments may have an average line edge roughness of 3 to 7 nm as measured by a scanning electron microscope.

The present disclosure provides many different embodiments of fabricating a FinFET device that provide one or more improvements over existing approaches. In one embodiment, the present disclosure provides a method for forming a FinFET structure, including providing a FinFET precursor including a plurality of fins and a plurality of gate trenches between the fins; forming a first portion of the trench dummy of a dummy gate within the plurality of gate trenches; removing at least a part of the first portion of the trench dummy; forming a second portion of the trench dummy over the first portion of the trench dummy; performing a first thermal treatment to the first and second portions of the trench dummy; and forming a blanket dummy of the dummy gate over the second portion of the trench dummy.

Further, other embodiments of the present application provide a method for forming a semiconductor structure, including: providing a substrate having a plurality of protrusions and a plurality of trenches between the protrusions; forming a first silicon-containing material within the plurality of trenches; removing at least a part of the first silicon-containing material; forming a second silicon-containing material over the first silicon-containing material; changing the phase of the first or second silicon-containing material to micro-polycrystalline; and forming a third silicon-containing material of micro-polycrystalline over the second silicon-containing material.

Further yet, other embodiments of the present application provide a semiconductor structure, including a substrate, a plurality of fins on the substrate, a gate dielectric on the plurality of fins, and a metal gate on the gate dielectric, wherein the metal gate includes one or more micro-polycrystalline silicon particles.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a FinFET structure, comprising:
providing a FinFET precursor comprising a plurality of fins and a plurality of gate trenches between the fins, the plurality of fins comprising a first fin and a second fin;
forming a first portion of a trench dummy of a dummy gate within the plurality of gate trenches;
removing at least a part of the first portion of the trench dummy;
forming a second portion of the trench dummy over the first portion of the trench dummy;
performing a first thermal treatment to the first and second portions of the trench dummy at a first temperature, wherein the second portion of the trench dummy has a substantially flat top surface continuously extending from the first fin to the second fin; and
forming a blanket dummy of the dummy gate over the substantially flat top surface of the second portion of the trench dummy at a second temperature lower than the first temperature.

2. The method according to claim 1, wherein the forming the first or second portion of the trench dummy is conducted at a temperature of about 300 to 550° C.

3. The method according to claim 1, wherein the first temperature ranges from about 500 to 950° C.

4. The method according to claim 1, wherein the blanket dummy comprises a micro-polycrystalline structure.

5. The method according to claim 1, wherein the dummy gate comprises grains with a bimodal size distribution.

6. The method according to claim 5, further comprising performing a second thermal treatment to the dummy gate after the formation of the blanket dummy.

7. The method according to claim 6, wherein after the second thermal treatment, the trench dummy comprises a micro-polycrystalline structure.

8. The method according to claim 6, wherein after the second thermal treatment, the dummy gate comprises grains with an average grain size of about 0.5 to 10 nm.

9. The method according to claim 6, wherein after the second thermal treatment, the dummy gate comprises equi-axed grains.

10. The method according to claim 6, wherein after the second thermal treatment, the dummy gate comprises grains with a monomodal size distribution.

11. A method for forming a semiconductor structure, comprising:
providing a substrate having a plurality of protrusions and a plurality of trenches between the protrusions;
forming a first silicon-containing material within the plurality of trenches;
removing at least a part of the first silicon-containing material;
forming a second silicon-containing material over the first silicon-containing material;
changing a phase of the first or second silicon-containing material to micro-polycrystalline at a first temperature; and
forming a third silicon-containing material of micro-polycrystalline over the second silicon-containing material of micro-polycrystalline at a second temperature lower than the first temperature.

12. The method according to claim 11, wherein the plurality of trenches have a height-to-width aspect ratio of about 0.7 to 7.

13. The method according to claim 11, wherein the third silicon-containing material of micro-polycrystalline is formed over the second silicon-containing material having an upper surface at a level higher than an upper surface of each protrusion.

14. The method according to claim 11, further comprising reflowing the first silicon-containing material prior to the removing at least the part of the first silicon-containing material.

15. The method according to claim 14, wherein the reflowing the first silicon-containing material is conducted at a temperature greater than a temperature for forming the first silicon-containing material.

16. The method according to claim 14, wherein the forming the first or second silicon-containing material is conducted at a temperature higher than a temperature for removing at least the part of the first silicon-containing material.

17. The method according to claim 11, further comprising reflowing the first, second and third silicon-containing materials.

18. The method according to claim 17, wherein the reflowing the first, second and third silicon-containing materials is conducted at a third temperature higher than the second temperature.

19. A method for forming a semiconductor structure, comprising:
   providing a substrate having a plurality of trenches;
   forming a first material within the plurality of trenches, wherein the first material is amorphous;
   removing at least a part of the first material;
   forming a second material over the first material, wherein the second material is amorphous;
   changing a phase of the first material to micro-polycrystalline; and
   forming a third micro-polycrystalline material over the second material having a minimum height greater than a maximum depth of the trenches.

20. The method according to claim 19, wherein the first material after crystallization and the third micro-polycrystalline material has a grain size mismatch exceeding 5%.

* * * * *